US006292400B1

(12) United States Patent
Dozza et al.

(10) Patent No.: US 6,292,400 B1
(45) Date of Patent: Sep. 18, 2001

(54) NON-VOLATILE MEMORY DEVICE WITH LOW POWER CONSUMPTION AND RELATIVE WRITING, READING AND ERASING METHODS

(75) Inventors: David Dozza, Villanova Di Castenaso; Roberto Canegallo, Tortona; Michele Borgatti, Finale Emilia, all of (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/620,765

(22) Filed: Jul. 21, 2000

(30) Foreign Application Priority Data

Jul. 22, 1999 (IT) .............................. MI99A1618

(51) Int. Cl.[7] .................................................. G11C 16/00
(52) U.S. Cl. .............................. 365/185.25; 365/185.28; 365/185.29
(58) Field of Search ................. 365/185.25, 185.05, 365/185.28, 185.29, 185.18, 203

(56) References Cited

U.S. PATENT DOCUMENTS

| 4,377,857 | * | 3/1983 | Tickle | 365/185.25 |
| 5,465,231 | * | 11/1995 | Ohsaki | 365/185.25 |
| 6,125,057 | * | 9/2000 | Loeper | 365/185.25 |

* cited by examiner

Primary Examiner—Tan T. Nguyen
(74) Attorney, Agent, or Firm—Theodore E. Galanthay; David V. Carlson; Seed Intellectual Property Law Group PLLC

(57) ABSTRACT

A non-volatile memory device organized with memory cells arranged by rows and columns in a matrix structure comprising source lines for memory cell groups. A switch is set between at least two rows or columns or source lines, which has two no pilotable terminals connected respectively to each one of the two rows or columns or source lines and a pilotable terminal connected to a logic circuitry. The switch allows a precharge of one of the two rows or columns or source lines by capacitive means associated to a each one of the two rows or columns or source lines after the other of the two rows or columns or source lines is connected to a higher voltage than that of said one of the two rows or columns or source lines.

19 Claims, 4 Drawing Sheets

NON-VOLATILE MEMORY DEVICE WITH LOW POWER CONSUMPTION AND RELATIVE WRITING, READING AND ERASING METHODS

TECHNICAL FIELD

The present invention relates to a non-volatile memory device. Particularly the present invention relates to a non-volatile memory device with low power consumption and to relative writing, reading and erasing methods.

BACKGROUND OF THE INVENTION

The considerable expansion in the market of portable applications utilizing non-volatile memory devices, above all Flash memory devices, has notably increased the request of devices with high integration and low power consumption. Such memory devices are not naturally formed to operate with a low power consumption because high voltages must be utilized to move charges in the insulated gate during the erasing and programming operations, the voltages are generated for the most part internally by charge pumps. Thus, a main problem for such non-volatile memory devices, is in the power consumption thereof.

In a CMOS device it is generally known that the power consumption derives both from a static power consumption and a dynamic power consumption. The static power consumption depends essentially on the bias and leakage currents, while the dynamic power consumption is due mainly to the current transistors during the commutations and to charging and discharging the capacitive nodes. However it is generally known that in the digital devices the static consumption is negligible with respect to the dynamic consumption.

In a digital circuit utilizing capacitive nodes with potential transactions between voltage levels which code logic signals, generally the ground voltage for the logic level 0 and the supply voltage for the logic level 1, the dynamic power consumption can be expressed by the following relation:

$$\text{Pdiss proportional to } f \cdot V_{dd}^{2} \cdot A_i C_i$$

wherein $C_i$ represents the charge capacity of the node i-eth summed up the N circuit nodes, f is the work frequency of the circuit, $V_{dd}$ is the supply voltage, $A_i$ is the activity factor (number of gates switching with respect to the total gate number) at the node i.

A non volatile memory device of the EPROM, EEPROM or Flash type is usually formed by a matrix structure where the memory cells are organized by rows and columns and comprise MOS transistors having each one a floating gate. The reading, writing and erasing operations of the memory cells are effectuated by applying suitable voltages to the row and column, which are selected by a row and a column decoder, and to the source line.

In the aforementioned operations the nodes of the memory cell which are connected to the suitable voltage suffer transactions among the different potential levels and this allows to charge and to discharge the parasitic capacities connected to the row, column and source line of the cell. In fact, if we consider, for example, a writing operation in the memory cell belonging to a first row and column, the first column must be connected to a prefixed voltage (for example it is comprised between 4V and 6V if the supply voltage is 5V) and the first row to a considerably higher voltage than the supply voltage (for example it is comprised between 10V and 12V and provided by a charge pump). A successive writing in another memory cell belonging to a second row and column causes the discharge of the first row and column and the connection of the second row and column to prefixed voltages.

However the memory cell reading, writing and erasing operations cause a considerably power consumption, above all in the writing and erasing operations wherein the voltages used are high, because the power used in the rows or columns or source lines of the memory cells already read or written or erased cannot be reutilized.

SUMMARY OF THE INVENTION

In view of the state of the art described, it is in object of the present invention to show a non-volatile memory device which by a simplex circuit typology allows low power consumption and relative writing, reading and erasing methods.

According to the present invention, such object is attained by a non-volatile memory device organized with memory cells arranged by rows and columns in a matrix structure comprising source lines for memory cell groups. A switch is set between at least two of said rows or columns or source lines, said switch having power carrying terminals connected respectively to each one of said two rows or columns or source lines and a control terminal connected to a logic circuitry programmed so that the switch allows a precharge of one of said two rows or columns or source lines by capacitive means associated with each one of said two rows or columns or source lines after that the other of said two rows or columns or source lines has been connected to a higher voltage than that of said one of said two rows or columns or source lines.

Thanks to the present invention it is possible to form a non volatile memory device which allows a lower power consumption than the typical devices during the writing, reading and erasing operations in the memory cells.

BRIEF DESCRIPTION OF THE DRAWINGS

The features and the advantages of the present invention will be made evident by the following detailed description of a particular embodiment thereof, illustrated as not limiting example in the annexed drawings, wherein.

DETAILED DESCRIPTION OF THE INVENTION

Figure 1:
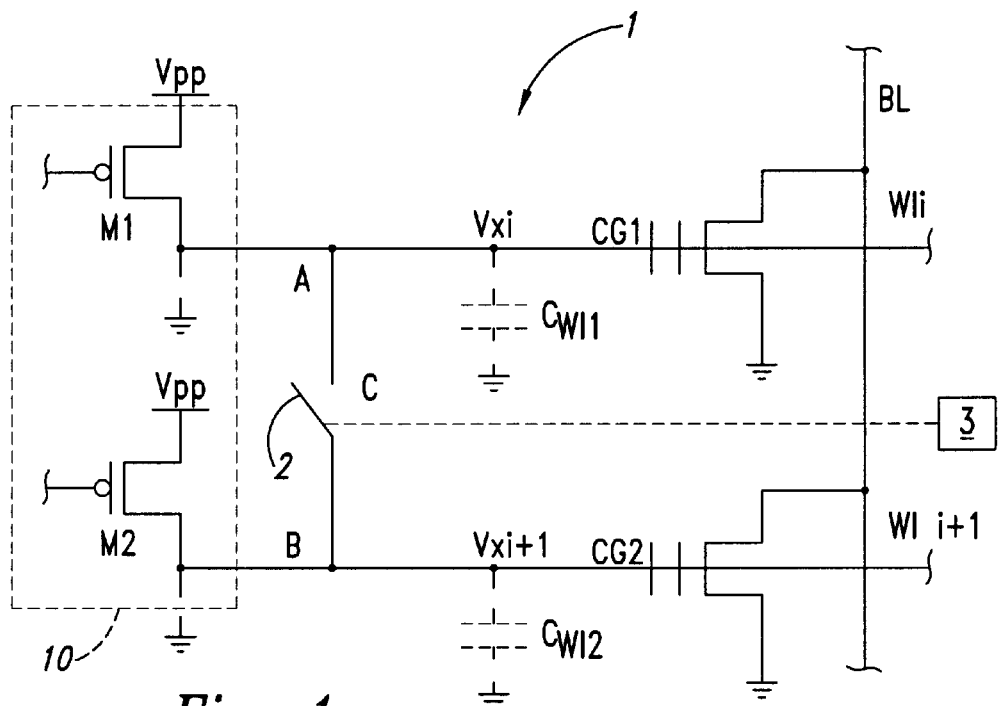
FIG. 1 is a circuit scheme of a part of a Flash memory device according to an embodiment of the present invention.

With reference to annexed drawings and mainly to FIG. 1, a circuit scheme 1 is shown of a part of a Flash memory device according to the invention which is formed by a matrix of Flash memory cells arranged by rows, called word-lines, and by columns, called bit-lines.

In FIG. 1 for example two word-lines Wli and Wli+1 are shown which can be connected to the programming voltage Vpp by respective PMOS transistors M1 and M2 which are parts of a row decoder 10. Also the word-line Wli and Wli+1 are connected to the gate terminal of two Flash memory cells, respectively CG1 and CG2, which of the drain terminal is connected to a bit-line BL. A switch 2 (which is shown schematically and is preferably formed by an MOS transistor) is set between the two word-lines Wli and Wli+1. A power carrying terminal A is connected to the word-line Wli and another power carrying terminal B is connected to word-line Wli+1. An enable terminal C is controlled by a logic circuitry 3. The circuit operates in the following manner.

Figure 2:
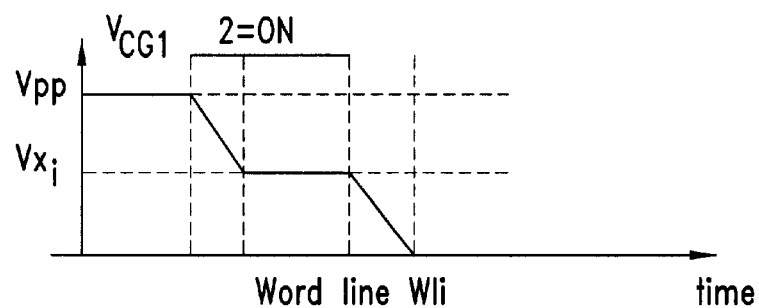
FIG. 2 is a graphic of the voltage on the gate of the Flash memory cell CGI of FIG. 1.
Figure 3:
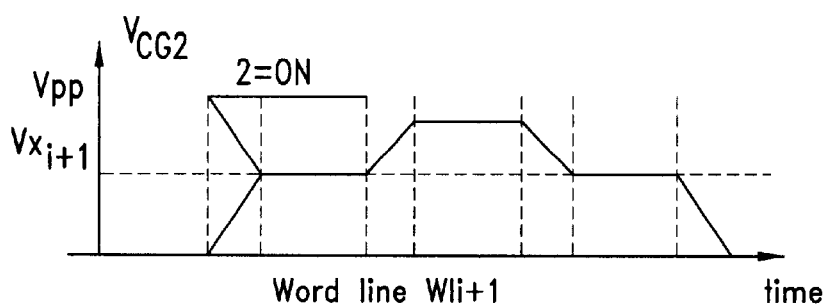
FIG. 3 is a graphic of the voltage on the gate of a Flash memory cell CG2 of FIG. 1.

If, for example, two successive writings in memory cells CG1 and CG2 are to be carried out, which belong respectively to two consecutive word-lines Wli and Wli+1, at a first time the transistor M1 is on so that the word-line Wli is brought to the potential Vpp. Each word line has a parasitic capacitance, CW, associated with it. This parasitic capacitance is a natural part of the word line based on its length, size and other properties. The voltage Vxi at the terminals of the parasitic line capacity Cwl1, which is connected to the word-line Wli at one terminal and has the other terminal at ground, is equal to Vpp. Then the transistor M1 is off so that the word-line Wli is no more connected to the voltage Vpp. The switch 2 is then closed by enable terminal C in order to distribute the charge between two word-lines Wli and Wli+1. The word-line Wli+1, and thus the voltage on the gate of the memory cell CG2, is brought to a potential Vxi+1=Vxi, after a certain transitory time period, as shown in more detail in FIGS. 2 and 3. The charge division with the two word-lines Wli and Wli+1 is obtained by the charge storage of the two respective parasitic line capacities Cwll for the word-line Wli and Cwl2 for the word-line Wli+1. Then, the switch 2 is turned off, so the word lines are not connected together. This can be seen in FIGS. 2 and 3, where the symbol 2=on is the time period switch 2 is on. The word-line Wli+1 is connected to the supply voltage Vpp by the transistor M2, after the switch 2 is off, in order to write in memory cell CG2. This is shown in FIG. 3, as the voltage Vpp is applied to the next word line.

This sequence may be repeated for successive word lines, Wli+2, Wli+3, Wli+4, etc., even though not shown in FIG. 1. Each has a switch between them and the adjacent word line so that the charge may be shared as described. Without the inventive charge dividing with the capacities Cwl1 and Cwl2 a power $E1=CVpp^2$, which must be provided with a suitable charge pump must be utilized. According to the invention when the capacitor Cwl2 is precharged to a potential Vxi, the power provided to charge is $E2=CVpp(Vpp-Vxi)$. If, for example, Vxi=Vpp/2 it is obtained E2=E1/2 and thus a savings of 50% of the dissipated power is obtained. Writing in memory cell CG2 causes naturally, as shown in graphic of FIG. 2, the discharge of the voltage on the gate of the memory cell CG1.

The same technology utilized to precharge one word line between two word-lines (which in the case above illustrated are for example consecutive) may be utilized even to precharge one between any two bit-lines or source lines. The lines do not need to be adjacent, but need to be connected by switch 2 and controlled with proper logic 3.

Figure 4:
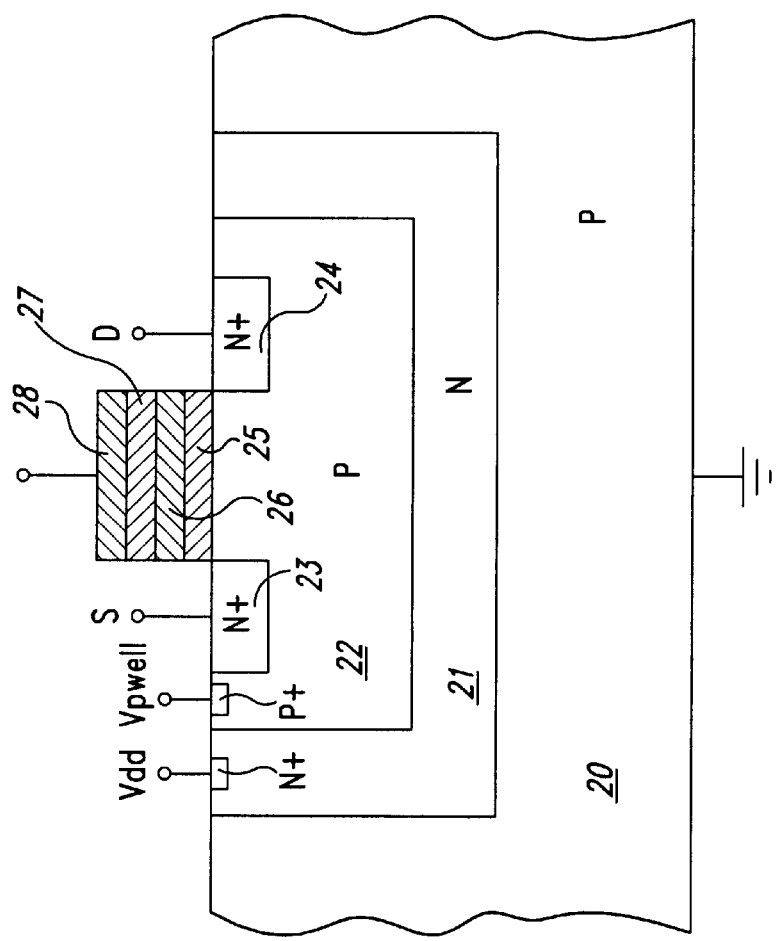
FIG. 4 is a schematic section of a part of a Flash memory device with a pwell.

In the actual programming technologies, applied to more recent non-volatile technologies, to reduce the currents used by the MOS transistors utilized to code the signals and the memory cells must be set in pwells, as it is shown for example in FIG. 4 where a single Flash memory cell is set in a pwell 22. N-type dopant is diffused in P-type silicon substrate 20, connected to ground, to form N-type silicon region 21, which is known as nwell and connected to the supply voltage Vdd. In the nwell 21 P-type dopant is implanted to form another P-type silicon region, which is known as pwell or triple well. The pwell 20 in this way may be connected to a voltage Vpwell and thus supplied in a different manner with respect to the substrate, which is common to all the devices implemented in that wafer. The voltage Vpwell must have a value such as to maintain in off state the p-n diode formed between the pwell 20 and nwell 21 (for example if the supply voltage Vdd is equal to 3V, the voltage Vpwell is equal to 2V or can be a negative voltage). The Flash memory cell is formed in the pwell 22 by N-type dopant diffusions to form the source region 23 with terminal S, and the drain region 24 with terminal D. At successive steps a first silicon oxide layer 25 is deposited, a first polysilicon layer 26 in order to form the floating gate, a second silicon oxide layer 27 and a second polysilicon layer 28 in order to form the control gate having a terminal G.

This explanation and associated graphic in FIG. 4 are provided to show one example of a basic EEPROM or Flash memory cell. Of course, the details and specifics of any non-volatile memory cell will be based on the desired design and process used. The invention may, of course, be used with non-volatile memory cell besides that shown in FIG. 4 and modifications to the cell are equivalent.

Figure 5:
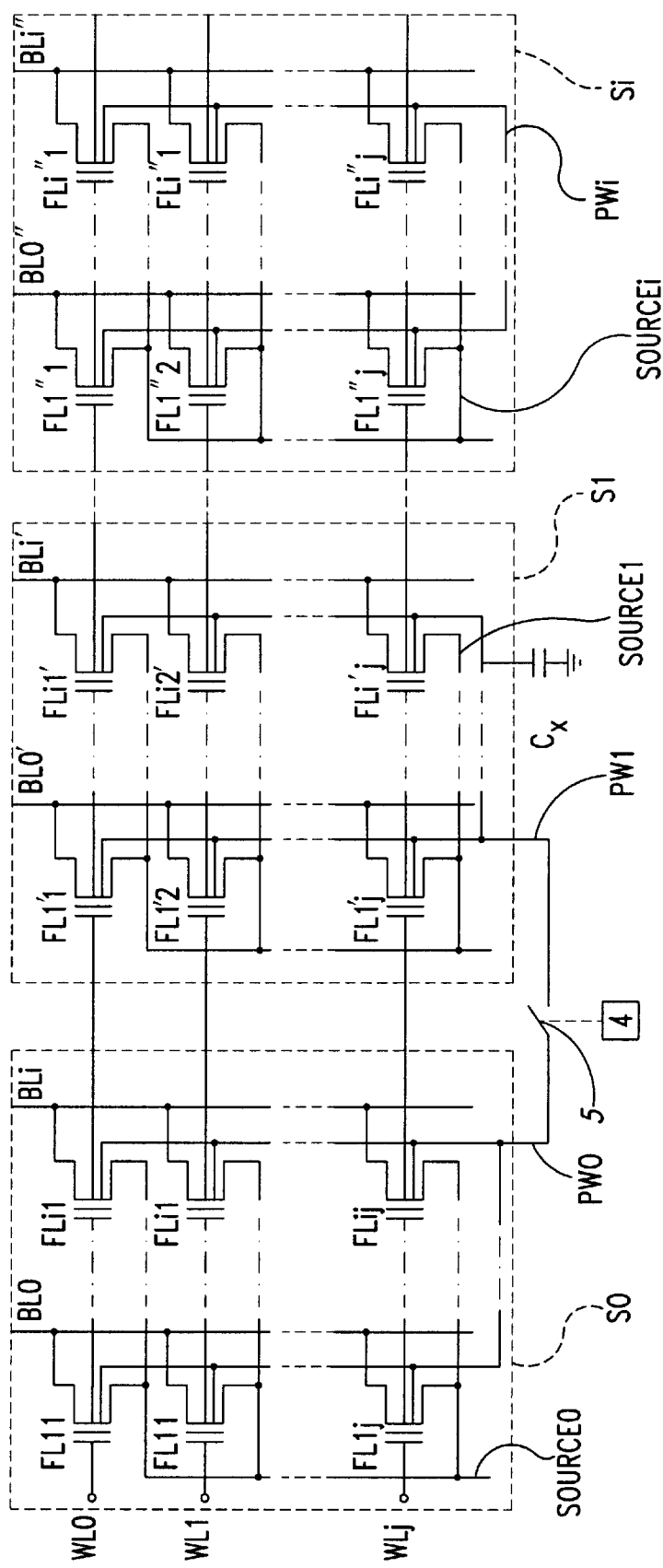
FIG. 5 is a circuit scheme of a Flash memory cell matrix with memory cell sectors organized in pwells and switch set between two pwells.

In FIG. 5 the formation of a memory cell matrix is shown by memory cells and relative column decode MOS transistors (which are shown schematically by switch) set in pwells. The memory cells Fl11 . . . Fli'j . . . Fli"j are organized in matrix sectors S0, S1, . . . Si having several bit-lines for each sector (the bit-lines BLO-BLi for the sector S0, the bit-lines BLO'-BLi' for the sector S1, the bit-lines BLO"-BLi" for the sector Si) and equal word-lines WL0, WL1, . . . WLj and such sectors are set each one in respective pwell Pw0, Pwl, . . . Pwi. In this way the memory cells relative to a same sector have source and bulk in common and this bears to have the number of source lines Source0, Source1, . . . Sourcei and bulk terminals equal to that of memory sectors and thus to that of the pwells. The capacities that exist are much greater than those associated to the normal word-lines or bit-lines, and this causes a considerable power consumption. The above described invention can be utilized inserting a switch 5, which is controlled by logic circuitry 4, between two pwell terminals PwO and Pwl to allow a precharge of one between two pwells utilizing the charges of the other pwell. Also the charge of one pwell can be utilized to precharge in addition to a second pwell, even the others in turn. For a further embodiment, storage capacitors can be provided by intentional design to store the charge that would be lost.

As shown in FIG. 5, an extra capacitor, Cx, can be added by design. Thus, Cx is not a parasitic capacitor, as exists normally on the bit line, pwell and nwell, but is a capacitor that has been added to assist in the storage of charge and sharing of charge according to the invention. In many embodiments, this capacitor Cx is not added and is not desired, since the parasitic capacitance is naturally present and it is desired to keep this capacitor low in value; however, if in some designs, the adding of an intentional capacitor Cx is formed by appropriate layers and doping to achieve a desired value.

Figure 6:
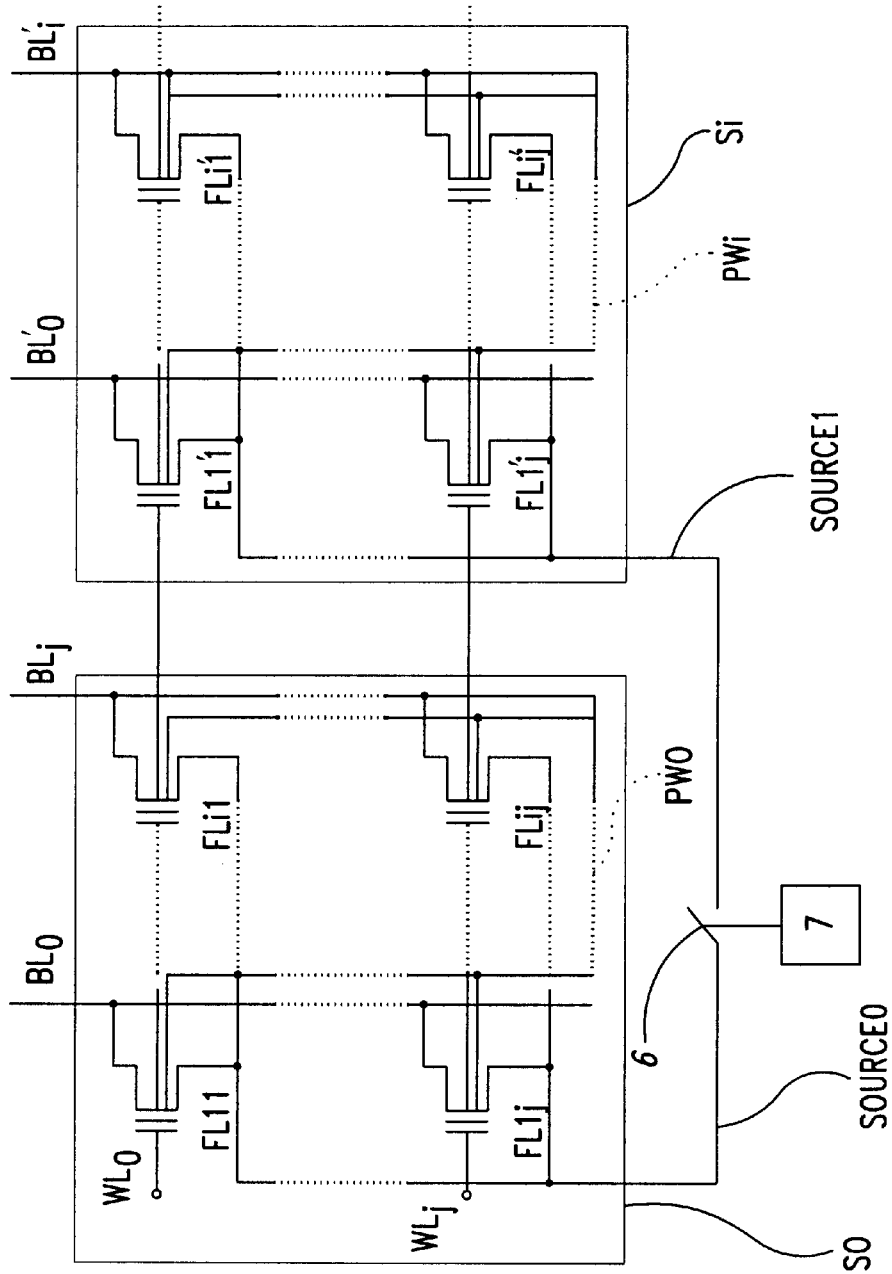
FIG. 6 is a part of the circuit scheme of FIG. 5 but with switch set between two source lines.

The same technology can be utilized inserting a switch 6, which is controlled by a logic circuitry 7, between two source line terminals Source0 and Source1 to allow to precharge of one by another source line utilizing the charges of the other source line, as schematically shown in FIG. 6. Also the charges of this next source line can be utilized to precharge besides a further source line and even the others in turn.

Although in the annexed drawings a single switch has been utilized for two rows or columns or source lines or pwells the use of more switch is often preferable in some embodiment of a memory device. A switch is formed between any row or column or source line or pwell couple and any other row, column, source line or pwell. Such switches can be used alternatively or simultaneously.

Such technology allows to perform memory cell writing, reading and erasing methods. The same technology as described and taught with FIGS. 1–3 can thus be used to save power when the pwell or nwell must be brought to a certain voltage.

A writing method of memory cells of a non-volatile memory device with memory cells CG1–CG2, FL11–Fli"j organized by rows Wli–Wli+1, WL0–WLJ and columns BL, BL0-BLi" in a matrix structure, comprising a first step to write in a first memory cell set in a first row and column by connecting the first row to a programming voltage Vpp and by simultaneously connecting the first column to a slower prefixed voltage than the programming voltage. The programming voltage Vpp is higher than the supply voltage and it is preferably a pulse voltage. Then the first row and column are disconnected from the relative voltages, a second step to write in a second memory cell set in a second row and column by connecting the second row to the programming voltage Vpp and by simultaneously connecting the second column to the slower prefixed voltage than the programming voltage. Then the second row and column are disconnected from the relative voltages. There is between the first step and second step a step to precharge the second row or column by a switch 2 set between the first and second row or column, and which transfers from the first row or column to the second row or column the charges stored in parasitic capacities belonging both to the first row or column and to the second row or column.

An erasing method of memory cells of a non-volatile memory device with memory cells CG1–CG2, FL11–Fli"j organized by rows Wli–Wli+1, WL0–WLj and columns BL, BLO-BLi" and source lines Source0, Source1, . . . Sourcei for memory cell groups S0, S1, . . . Si, comprises a first step to erase in a first memory cell which is set on a first row and belongs to a first memory cell group with relative first source line by connecting the first row to an erasing voltage and by simultaneously connecting the first source line to a higher absolute value voltage than the supply voltage. The erasing voltage is slower than the supply voltage when the higher absolute value voltage than the supply voltage is positive, while the erasing voltage is higher than the supply voltage when the higher absolute value voltage than the supply voltage is negative, and also the erasing voltage is preferably a pulse voltage. Then the first row and source line are disconnected from the relative voltages and a second step to erase in a second memory cell which is set in a second row and belongs to a second memory cell group with relative second source line by connecting the second row to the erasing voltage and by simultaneously connecting the second source line to the higher voltage than the supply voltage in absolute value and then disconnecting the second row and source line from the relative voltages. There is between the first step and second step a step to precharge the second row or source line by a switch 2, set between the first and second rows or source lines, and which transfers from the first row or source line to the second row or source line the charges stored in parasitic capacities associated to each one of the first and second row or source line. If the non-volatile memory device is a Flash memory device during the step to erase a memory cell set in one row and memory cell group, all the memory cells belonging to said one row and memory cell group are erased.

A reading method of memory cells of a non-volatile memory device with memory cells CG1–CG2, FL11–Fli"j organized by rows Wli–Wli+1, WL0–WLj and columns BL, BL0-BLi" in a matrix structure, comprises a first step to read in a first memory cell set in a first row and column by connecting the first row to a supply voltage and by simultaneously connecting the first column to a slower voltage than the supply voltage. Then the first row and column are disconnected from the relative voltages and there is a second step to read in a second memory cell set in a second row and column by connecting the second row to said supply voltage and by simultaneously connecting the second column to the slower voltage than the supply voltage and then disconnecting the second row and column from the relative voltages. There is between the first step and second step a step to precharge the second row or column by a switch 2 set between the first and second row or column, and which transfers from the first row or column to the second row or column the charges stored in parasitic capacities belonging to each one of the first and second row or column.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A non-volatile memory device organized with memory cells arranged by rows and columns in a matrix structure comprising source lines for memory cell groups;

a switch connected between at least two of said rows or columns or source lines, said switch having two power carrying terminals connected respectively to each one of said two rows or columns or source lines; and a control terminal connected to a logic circuitry programmed so that said switch allows a precharge of one of said two rows or columns or source lines by capacitive means associated with each one of said two rows or columns or source lines after that the other of said two rows or columns or source lines has been connected to a higher voltage than that of said one of said two rows or columns or source lines.

2. A memory device according to claim 1, wherein said switch is a MOS transistor.

3. A memory device according to claim 1, wherein said capacitive means are parasitic capacities.

4. A non-volatile memory device organized with memory cells arranged by rows and columns in a matrix structure divided in memory cell sectors each one set in respective first conductance type semiconductor wells, said first conductance type semiconductor wells being formed in second conductance type semiconductor wells formed also in first conductance type substrate of the wafer where said memory device is implemented; and a switch between at least two of said first conductance type semiconductor wells, said switch having a control terminal connected to a logic circuitry programmed so that said switch allows to precharge one between said two first conductance type semiconductor wells by capacitive means associated to each one of said two first conductance type semiconductor wells after the other of said two first conductance type semiconductor wells has been connected to a higher voltage than that of said one of said two first conductance type semiconductor wells.

5. A memory device according to claim 4, wherein said first conductance type semiconductor wells are P-type semiconductor wells.

6. A memory device according to claim 4, wherein said switch is a MOS transistor.

7. A memory device according to claim 4, wherein said non-volatile memory device is a Flash memory device.

8. A memory device according to claim 4, wherein said capacitive means are parasitic capacities.

9. The memory device of claim 4 wherein said capacitance is a designed, intentionally formed capacitor.

10. A writing method of memory cells of a non-volatile memory device with memory cells organized by rows and columns in a matrix structure, comprising:

writing in a first one of said memory cells which is set in a first one of said rows and columns connecting said first one of said rows to a programming voltage and connecting said first one of said columns to a slower prefixed voltage than said programming voltage and then disconnecting said first ones of said rows and columns from the relative voltages;

writing in a second one of said memory cells which is set in a second one of said rows and columns connecting said second one of said rows to a programming voltage and connecting said second one of said columns to a slower prefixed voltage than said programming voltage and then disconnecting said second ones of said rows and columns from the relative voltages; and precharge, prior to the writing in the second one of the memory cells, said second one of said rows or columns by a switch connected between said first one and second one of said rows or columns, and which transfers from said first one of said rows or columns to said second one of said rows or columns the charge stored in capacitive means belonging to each one of said first one and second one of said rows or columns.

11. A method according to claim 10, wherein said programming voltage is higher than said supply voltage.

12. A method according to claim 10, wherein said programming voltage is a pulse voltage.

13. An erasing method of memory cells of a non-volatile memory device with memory cells organized by rows and columns and source lines in memory cell groups, comprising:

a first step to erase in a first one of said memory cells which is set on a first one of said rows and belonging to a first one of said memory cell groups with relative first one of said source lines by connecting said first one of said rows to an erasing voltage and simultaneously connecting said first one of said source lines to a higher absolute value voltage than the supply voltage and then disconnecting said first ones of said rows and source lines from the relative voltages;

a second step to erase in a second one of said memory cells which is set in a second one of said rows and belonging to a second one of said memory cells groups with relative second one of said source lines by connecting said second one of said rows to the erasing voltage and simultaneously connecting said second one of said source lines to said higher absolute value voltage than the supply voltage and then disconnecting said second ones of said rows and source lines from the relative voltages; and between said first step and second step a step precharging said second one of said rows or source lines by a switch set between said first one and second one of said rows or source lines, and which transfers from said first one of said rows or source lines to said second one of said rows or source lines the charges stored in capacitive means associated to each one of said first one and second one of said rows or source lines.

14. A method according to claim 13, wherein said erasing voltage is slower than said supply voltage when said higher absolute value voltage than the supply voltage is positive, while said erasing voltage is higher than said supply voltage when said higher absolute value voltage than the supply voltage is negative.

15. A method according to claim 13, wherein said erasing voltage is a pulse voltage.

16. A method according to claim 13, wherein said non-volatile memory device is a Flash memory device.

17. A method according to claim 16, wherein, during the erasing step of one of said memory cells which is set in one of said rows and in one of said memory cell groups, erasing all the memory cells belonging to said one row and memory cell group.

18. A reading method of memory cells of a non-volatile memory device with memory cells organized by rows and columns in a matrix structure, comprising:

a first step to read in a first one of said memory cells which is set in a first one of said rows and columns by connecting said first one of said rows to a supply voltage and simultaneously connecting said first one of said columns to a slower voltage than said supply voltage and then disconnecting said first ones of said rows and columns from the relative voltages;

a second step to read in a second one of said memory cells which is set in a second one of said rows and columns connecting said second one of said rows to said supply voltage and simultaneously connecting said second one of said columns to said slower voltage than said supply voltage and then disconnecting said second ones of said rows and columns from the relative voltages; and between said first step and second step a step to precharge said second one of said rows or columns by a switch set between said first one and second one of said rows or columns, and which transfers from said first one of said rows or columns to said second one of said rows or columns the charges stored in capacitive means belonging to each one of said first one and second one of said rows or columns.

19. A method according to claim 18, wherein said capacitive means are parasitic capacities.

* * * * *

UNITED STATES PATENT AND TRADEMARK OFFICE
CERTIFICATE OF CORRECTION

PATENT NO. : 6,292,400 B1  
DATED : September 18, 2001  
INVENTOR(S) : Davide Dozza et al.

It is certified that error appears in the above-identified patent and that said Letters Patent is hereby corrected as shown below:

<u>Title page,</u>
Item [75], the first listed inventor should read as -- Davide Dozza --.

Signed and Sealed this

Second Day of April, 2002

Attest:

Attesting Officer

JAMES E. ROGAN
*Director of the United States Patent and Trademark Office*